United States Patent
Anderson et al.

(10) Patent No.: US 6,393,594 B1
(45) Date of Patent: May 21, 2002

(54) METHOD AND SYSTEM FOR PERFORMING PSEUDO-RANDOM TESTING OF AN INTEGRATED CIRCUIT

(75) Inventors: Carl J. Anderson, Austin; Michael Stephen Floyd, Leander; Larry Scott Leitner, Austin; Bradley McCredie, Austin; Kevin Franklin Reick, Austin; Jennifer Lane Vargus, Cedar Park, all of TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/372,698

(22) Filed: Aug. 11, 1999

(51) Int. Cl.⁷ ................................................. G06F 11/00
(52) U.S. Cl. ..................... 714/738; 714/739; 714/724
(58) Field of Search ................................. 714/733, 734, 714/738, 724, 48, 45, 739, 736

(56) References Cited

U.S. PATENT DOCUMENTS 5,170,398 A * 12/1992 Fujieda et al. ............... 714/738
5,758,120 A * 5/1998 Kahle et al. ................. 395/477
6,182,258 B1 * 1/2001 Hollander .................... 714/739

* cited by examiner

*Primary Examiner*—Phung M. Chung
(74) *Attorney, Agent, or Firm*—Anthony V. S. England; Bracewell & Patterson, L.L.P.

(57) ABSTRACT

A method and system for testing an integrated circuit. A test substrate is provided which is manufactured by the same particular production technology for which the integrated circuit is designed. A pattern generator for generating test data and a result checker for comparing output data are embedded on the test substrate. Isolated portions of circuitry of the integrated circuit are selectively embedded onto the test substrate. Test data from the pattern generator is applied to the isolated portions of circuitry under a first operating condition. The data output from the isolated portions of circuitry is selectively recorded into the result checker. The isolated portions of circuitry are then subjected to testing by applying test data from the pattern generator to the isolated portions of circuitry under a second operating condition. Errors in the isolated portions of circuitry are detected with the result checker by comparing data output from the isolated portions of circuitry with the selectively recorded data output, such that the integrated circuit is tested by subsets, independently of testing the integrated circuit in its entirety.

17 Claims, 9 Drawing Sheets

METHOD AND SYSTEM FOR PERFORMING PSEUDO-RANDOM TESTING OF AN INTEGRATED CIRCUIT

BACKGROUND OF THE INVENTION

1. Technical Field

The present invention relates in general to an improved method and system for testing an integrated circuit and more particularly to a test chip for performing pseudo-random testing of a complex integrated circuit. Still more particularly, the present invention relates to a method and system for detecting errors in a subset of the complex integrated circuit which is embedded within a test chip, independent of the complex integrated circuit.

2. Description of the Related Art

As integrated circuit technology has advanced, the complexity and density of circuit devices formed within a single chip has increased dramatically. Consequently, several problems have arisen with regard to testing proper operation of such integrated circuits. For example, while the methodology for testing an integrated circuit (IC) may be relatively straight forward, most IC chips typically have far fewer I/O pins available to a circuit tester than are required to adequately test the IC and at the same time maintain the cost and functionality thereof. In addition, most high end commercial testers can not provide a large number of I/Os at speed to adequately test the design.

A general solution to the above-described problem is to embed a majority of the test circuitry on the chip itself rather relying solely on an external testing mechanism. Such testing facilities are frequently referred to as built-in self-test(BIST), array self-test (AST), array built-in self-test (ABIST), or logical built-in self-test (LBIST) circuits and will hereinafter be referred to generically as BIST circuits. BIST circuits are typically controlled by an external tester which provides a clock signal, scans test data in and scans results out of the BIST circuit. In general, a BIST circuit applies the received test data to functional units within an integrated circuit in which the BIST circuit is embedded and then compares the data output therefrom with expected data. In addition the data output from the functional units during testing is scanned out to a memory array within the external tester. In response to a discrepancy between the output data and the expected data, the BIST circuit indicates that a failure has been detected and after a delay, the application of data is halted and eventually the cycle during which the failure occurred is detected from data which is scanned out. Thereafter, the BIST circuit is re-run to the cycle in which the failure occurred. The state machine data at the failing cycle is then scanned out and utilized to generate a bit-fail map for use in failure analysis.

A general shortcoming of the BIST testing methodology is the inability of the cycle of failure to be precisely detected at typical operating speeds of fast memories (e.g. greater than 200 MHz) because of the latency of data transmittal between the BIST circuit and the external tester. In order to properly detect the cycle of failure after the BIST is halted, complex algorithms are typically employed which may take many hours or even days to determine the cycle of failure. Further complicating this shortcoming is the increase in the volume of data which is processed in a period of time as IC speeds increase (e.g. greater than 1 GHz). In testing complex integrated circuits, and in particular in testing processors, it is desirable to determine faults as quickly as possible in order to decrease time to develop faster processor speeds.

Further, no commercial external tester is available which can provide data patterns to a BIST circuit of an IC at speed for frequency ranges such as 1 GHz or greater and with a large number of channels (i.e. greater than 640 channels). Thereby, even though the operational frequency of the chip may be 1 GHz, during testing, the frequency of operation would be limited by the latency of transfer between the external tester and the IC. In addition, specialized I/O circuits which could communicate with the external tester to send and receive signals at this high rate of frequency would be necessary in an IC, adding circuit complexity to the IC for testing purposes. Further limiting the testing of an IC, a BIST circuit cannot test data over continuous functional clock cycles because a pattern must be scanned in, a few functional clock cycles issued, and a result scanned out.

Importantly, in adding BIST circuitry to an IC, the complexity of BIST testing circuitry must be balanced with the functional circuitry of the IC. However, in designing for increased processor speeds, such as 1 GHz or greater, the volume of processor operations which can be performed per cycle is increased, thereby increasing the complexity of circuitry and the number of data paths within the functional units of the IC which need to be checked for errors. Thereby, the width of test data vectors needed to properly test the functionality of such a processor is expanded to such a point that testing the processor with a BIST test would add an undesirable amount of circuitry. In addition, supplying a wider test vector from the external tester to the IC would further add to the latency of transmittal between external tester and IC.

In addition, BIST circuits do not have the advantage of providing test data subject to environmental conditions present within an integrated circuit such as noise, temperature, frequency limitations, etc. In particular, when designing for increased processor speeds such as 1 GHz or greater, these environmental conditions are expected to be magnified in comparison to slower processor speeds.

Therefore, as production technologies are improving to provide for the manufacture of ICs which operate at very high frequencies, testing technology utilized to test these faster chip is needed. As should thus be apparent, an improved method for testing a complex integrated circuit is needed such that a cycle of failure may be detected in a timely manner, the width of test data vectors may be expanded in order to properly test the functionality of the complex integrated circuit, test data vectors may be provided and the results detected at speed, and conditions of operation such as environmental conditions and operation over a range of frequencies may be tested.

SUMMARY OF THE INVENTION

It is therefore one object of the present invention to provide an improved method and system for testing an integrated circuit.

It is another object of the present invention to a test chip for performing pseudo-random testing of an integrated circuit.

It is yet object of the present invention to provide a method and system for detecting errors in an integrated circuit by subsets which are embedded within a test chip, independently of testing the integrated circuit in its entirety.

The foregoing objects are achieved as is now described. The method and system of the present invention may be utilized to test a an integrated circuit designed for manufacture by a particular production technology. A test substrate is provided which is manufactured by the same particular production technology for which the integrated circuit is designed. A pseudo-random pattern generator for generating test data and a result checker for comparing output data are embedded on the test substrate. Isolated portions of circuitry of the complex integrated circuit are selectively embedded onto the test substrate. Test data from the pseudo-random pattern generator is applied to the isolated portions of circuitry under a first operating condition. The data output from the isolated portions of circuitry is selectively recorded into the result checker at a predetermined periodic rate. The isolated portions of circuitry are then subjected to testing by applying pseudo-random test data from the pattern generator to the isolated portions of circuitry under a second operating condition. Errors in the isolated portions of circuitry are detected with the result checker by comparing data output from the isolated portions of circuitry with the selectively recorded data output, such that the integrated circuit is tested by subsets independently of testing the entire integrated circuit.

It is an advantage of the method and system that the design process of the integrated circuit proceeds with efficiency by correcting errors found in the subset thereof.

The above as well as additional objects, features, and advantages of the present invention will become apparent in the following detailed written description.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION OF PREFERRED EMBODIMENT

Figure 1:
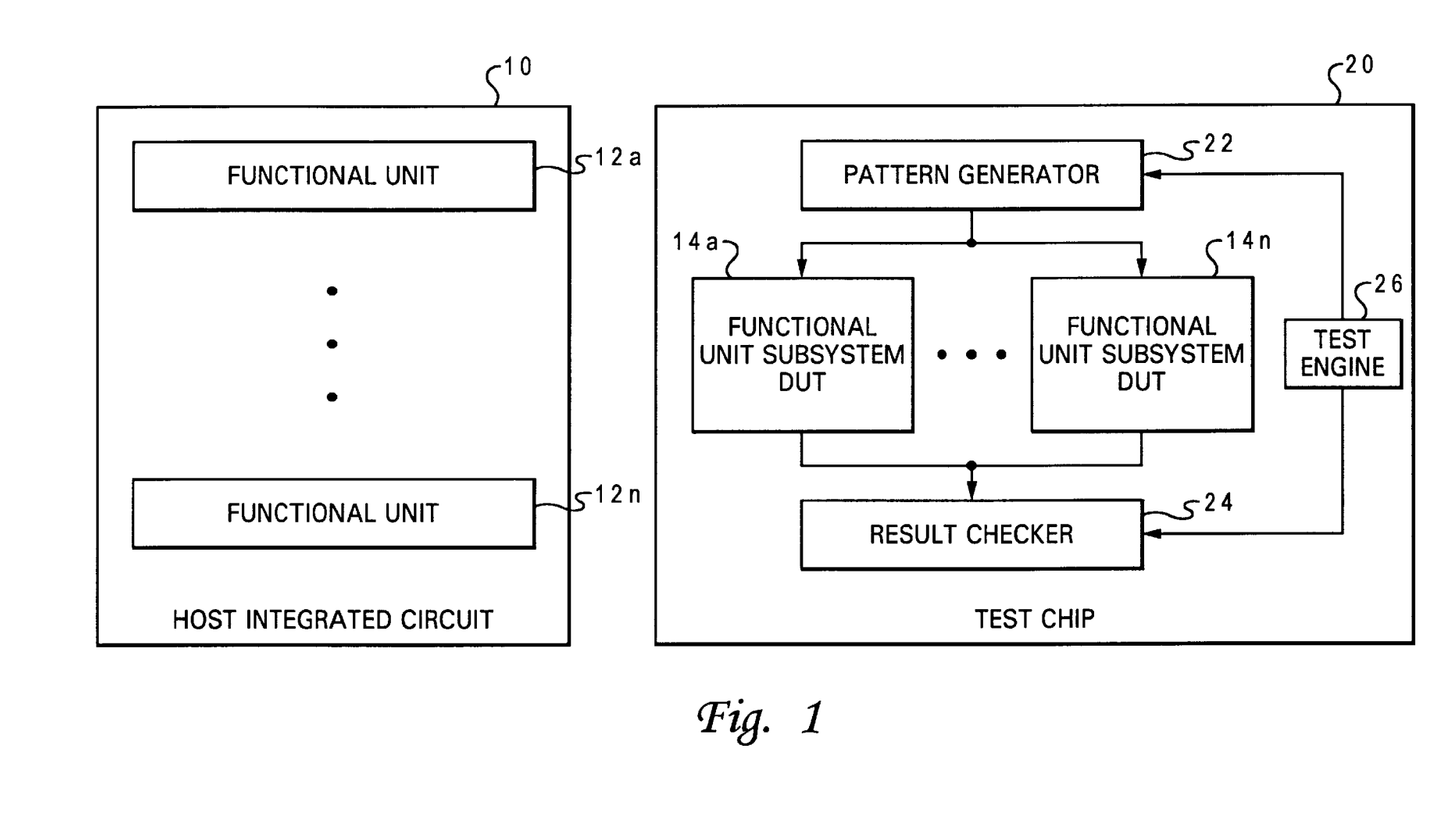
FIG. 1 illustrates a block diagram representation of a host integrated circuit and a test chip thereof.

With reference now to the figures and in particular with reference to FIG. 1, there is depicted a block diagram representation of a host integrated circuit (IC) 10 and a test chip 20. Host IC 10 includes multiple functional units 12a–12n embedded within host IC 10 as is well known in the art. Typically, functional units 12a–12n are interconnected by a bus system (not shown) as needed for operation, supplied appropriate power (not shown) and synchronized in operation by a clock signal (not shown). Functional units 12a–12n may work together to perform processing functions. In addition, although not depicted, a production technology of the many available production technologies known in the art for manufacturing complex integrated circuits is employed for the manufacture of host IC 10. In particular, the production technology utilized may determine the effective speed at which a host IC 10 may be clocked to properly function. More particularly, with the advancement of production technologies and materials used therein, such as copper interconnects, the effective speed at which host IC 10 may be clocked and function properly may be increased. However, other factors such as operating noise, temperature and frequency limitations may hinder the operation of a host IC 10. Often, therefore, functional units may be designed for a particular production technology, operating environment and frequency of operation, however actual frequency of operation cannot be truly known until the functional units are produced by the particular production technology and run within the actual operating environment.

Referring still to FIG. 1, a test chip 20 is depicted which includes multiple functional unit subsystem device under tests (DUTS) 14a–14n embedded within a test substrate. Each functional unit subsystem DUT is preferably an isolated portion of the circuitry from functional units 12a–12n of host IC 10 whereby test chip 20 includes a functional subsystem of host IC 10, independent in operation from host IC 10. Also embedded on test chip 20 are a pattern generator 22, a result checker 24, and a test engine 26. Pattern generator 22 includes multiple test patterns which are provided to each functional unit subsystem DUTs 14a–14n. Result checker 24 receives the data output from functional unit subsystem DUTs 14a–14n and checks the results against expected data therewithin to detect errors. Test engine 26 controls the coordination of data between pattern generator 22 and result checker 24 such as the sequencing of patterns of data provided to DUTs 14a–14n by pattern generator 22 and the sequencing of patterns of data to be compared in result checker 24. Preferably, test engine 26 is a programmable state machine which may be reset by an external control signal and includes a run function, stop on error function and looping ability.

Preferably, test chip 20 is manufactured with the same production technology for which host IC 10 is designed, whereby the actual operating frequency of host chip 10 may be tested. In addition, by including sequences of data patterns and control thereof on test chip 20, data may be supplied to the function unit subsystem DUTs 14a–14n at speed. Further, preferably, test chip 20 includes additional environmental components (not shown) which when test chip 20 is in operation, emulate the noise and temperature conditions expected within host IC 10. Thereby, in designing a product such as host IC 10 which is a highly complex integrated circuit, a less expensive and complex version thereof may be tested as test chip 20. In addition, the complexity of testing circuitry within host IC 10 may be effectively reduced by placing complex testing circuitry on test chip 20 in order to test for as wide of data vectors as needed with the expected production technology and operating conditions, thereby freeing circuitry within host IC 10 for additional functional units.

Figure 2:
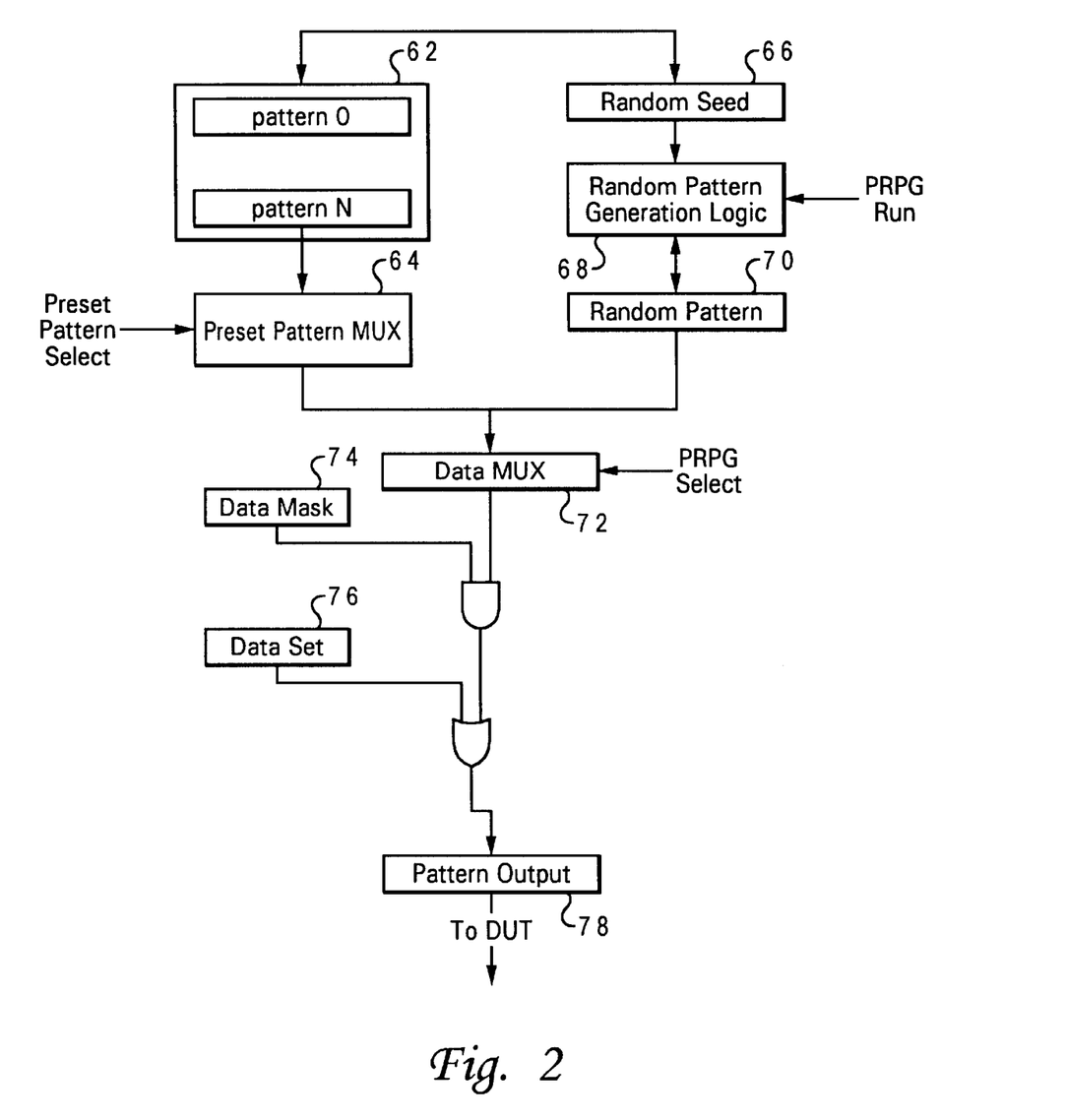
FIG. 2 illustrates a detailed block diagram of a pseudo-random pattern generator within a test chip.

Referring now to FIG. 2, there is depicted a detailed block diagram of a pseudo-random pattern generator within a test chip. As depicted, data to the DUTs may either be provided by a pseudo-random pattern generator logic 68 or from a pattern register 62. Random seed 66 provides a value from which pseudo-random pattern generator 68 derives data. As is well known in the art, for a particular seed, the same pseudo-random sequence of data may be obtained each time the sequence is generated for the seed. If pseudo-random pattern generator 68 is enabled to run by a PRPG run signal, a sequence of test data vectors is output from pseudo-random pattern generator 68 to a random pattern register 70 for each cycle of time.

Alternatively, test data vectors may be imported into pattern registers 62 and may be selected for output by preset pattern multiplexer (MUX) 64 which is an N-to-1 MUX. Sequences of test vectors may be entered into pattern registers 62 in order to test for errors due to particular sequences of data.

A data MUX 72, which is a 2-to-1 MUX, selects between the pattern register data and the pseudo-random data by a PRPG select signal. A data mask 74 and data set 76 may be input to registers in order to specialize the data test. For example, a portion of each test data vector intended for a particular DUT or DUTs may be ANDed with data mask 74 and Ored with data set 76 to force particular inputs (ie array write enables) to a particular fixed value for the duration of the random test. After any masking and setting, the test data vector is held by a pattern out register 78 which provides data to the DUTs.

Figure 3:
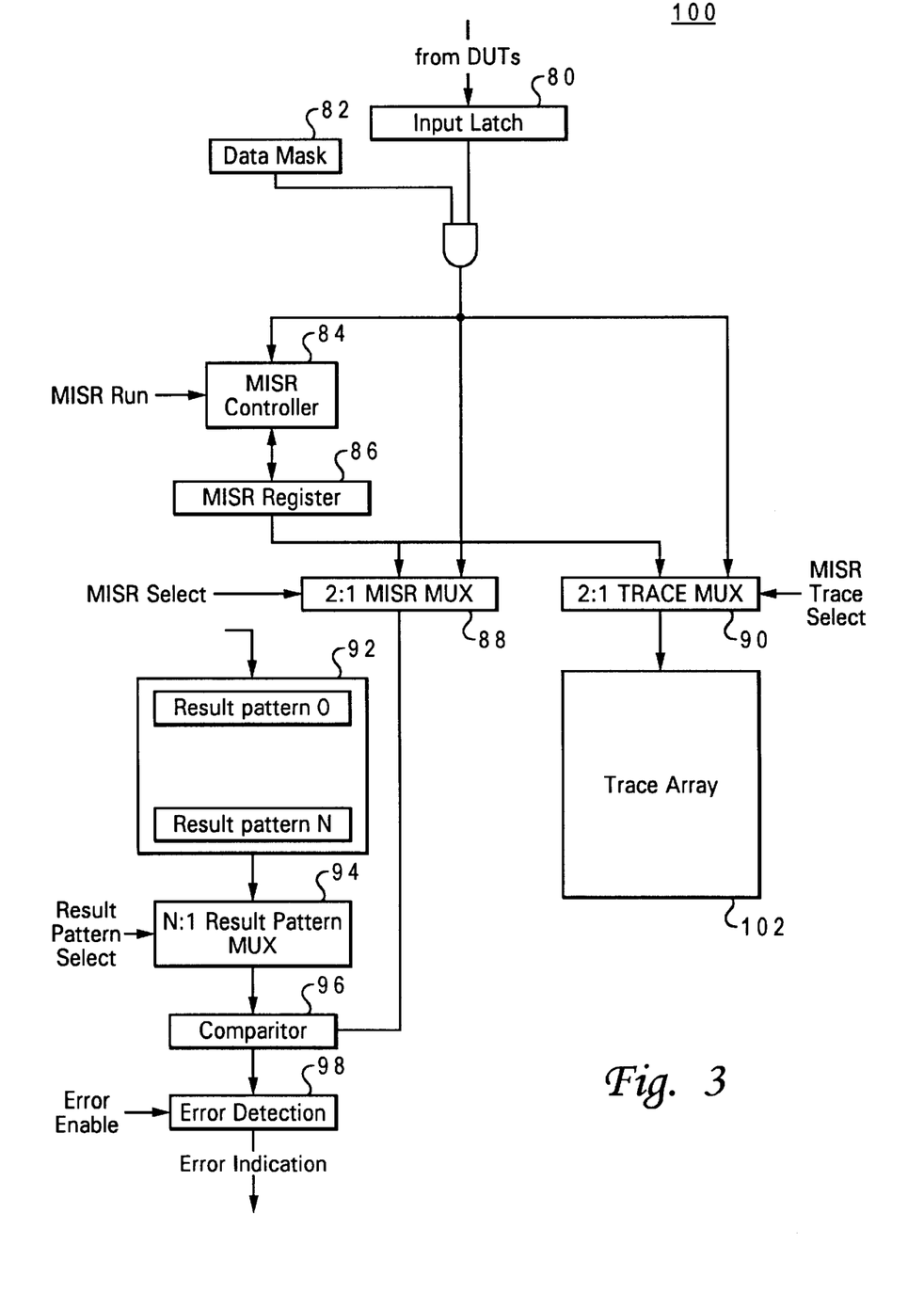
FIG. 3 depicts a detailed block diagram of a result checker for determining a failed signature within a test chip.

With reference now to FIG. 3, there is illustrated a detailed block diagram of a result checker for determining a failed signature within a test chip. Data is received from the DUTs into an input latch 80 of result checker 100. The data in input latch 80 is then ANDed with data mask 82 to specify a particular data pattern. Data mask 82 is stored to a register from an external input.

Result checker 100 may perform may compare test data with result patterns or may perform MISR data testing. In the case where a particular sequence of data patterns are selected in the pattern generator, a particular sequence of expected data patterns are available in result patterns 92. Preferably, the test data received at result checker 100 is selected by an MISR multiplexer 88 which is a 2-to-1 MUX selecting between a MISR register 86 and the test data. A result multiplexer 94, which is an N-to-1 MUX, selects from result patterns 92. A selected one of result patterns 92 is compared with the test data by comparitor 96. If the inputs are not equal, a high error signal is sent to error detection 98. If an error enable signal is applied to error detection 98 when the high error signal is received, an error indication signal will be supplied to the test engine in order to stop testing and determine the fault cycle. In addition, in utilizing result checker 100 to detect faults in a particular pattern sequence, the received test data is passed to a trace array 102 as selected by an MISR Trace Select signal to a trace multiplexer 90 which is a 2-to-1 MUX.

In running a test utilizing psuedo-random data, it is preferable to first run a test of the data at normal operating conditions and accumulate multiple input shift register 86 (MISR) signatures. The MISR signature is preferably accumulated in the MISR register 86 as controlled by MISR controller 84. Typically, as is well known in the art, an MISR is a shift register in which the output of each flip-flop in the register is exclusive ORed with an independent input before being input to the succeeding flip-flop as controlled by MISR controller 84. Further, multiple feedback exclusive OR gates are included in the feedback path from the output of the last flip-flop to the input of the first flip-flop for exclusive ORing into the feedback loop the output of intermediate flip-flops in the register as controlled by MISR controller 84. In particular, if a particular sequence of parallel signals is applied to the MISR controller 84, then a known signature pattern will exist in MISR register 86 at the end of the test sequence.

Thereby, in particular, when testing with pseudo-random test data, the first testing accumulates "good" MISR signatures under normal operating conditions into MISR register 86. When the MISR trace select signal is enabled, trace multiplexer 90 will pass the MISR signature to trace array 102. The MISR signatures in trace array 102 may be scanned into result pattern register 92. Thereafter, the same pseudo-random sequencing is preferably performed again wherein additional operating conditions may be applied. The MISR signature may be accumulated and enabled by the MISR select signal to be passed by MISR multiplexer 88 to comparitor 96. An expected "good" MISR signature stored in result patterns register 92 may be selected and compared with the current MISR signature whereby if an error occurs and is enabled, an error indication signal is output. Further, for testing and debugging, the test data output from the DUTs may be collected in trace array 102 as selected by the MISR trace select signal.

Figure 4:
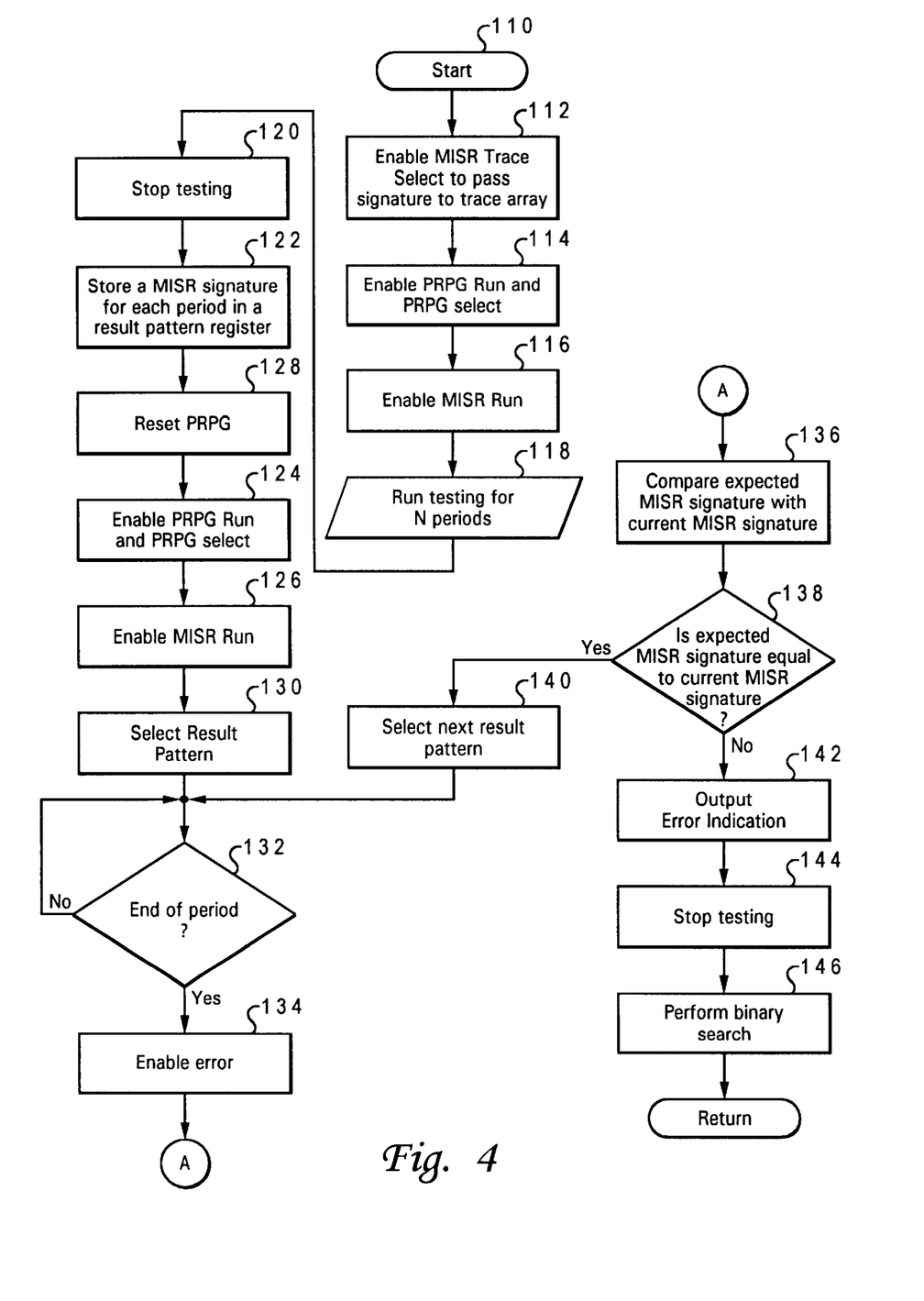
FIG. 4 illustrates a high level logic flowchart of a process for detecting a failed signature with the result checker depicted in FIG. 3.

Referring now to FIG. 4, there is illustrated a high level logic flowchart of a process for detecting a failed signature with the result checker depicted in FIG. 3. As depicted, the process starts at block 110 and proceeds to block 112. Block 112 illustrates enabling the MISR trace select signal to pass the MISR signature to the trace array. Next, block 114 depicts enabling the PRPG Run and PRPG select signals. With these signals enabled, the pattern generator begins to pass psuedo-random test data to the DUTs. Further, block 116 illustrates enabling the MISR Run signal which allows the MISR controller to receive input and accumulate a MISR signature.

Next, block 118 depicts running the test for N periods of time where there are N sampling periods. Thereafter, block 120 illustrates stopping the test. When the testing is stopped, the PRPG run and PRPG select signals are disabled. Next, block 122 depicts storing a MISR signature for each of N sampling periods in a result pattern register. Thereafter, block 128 illustrates resetting the PRPG. Next, block 124 illustrates enabling the PRPG run and PRPG select signals. Thereafter, block 126 depicts enabling the MISR run signal. Next, block 130 depicts selecting a result pattern.

Thereafter, block 132 illustrates a determination of whether a sampling period is complete. If a sampling period is not complete, the process iterates at block 132. If a sampling period is complete, the process passes to block 134. Block 134 depicts enabling the error enable signal. Thereafter, block 136 illustrates comparing the expected MISR signature with the current MISR signature. Next, block 138 depicts a determination of whether the expected MISR signature is equal to the current MISR signature. If the signatures are equal, the process passes to block 140. Block 140 illustrates selecting the next result pattern whereafter the process passes to block 132. If the signatures are not equal, the process passes to block 142. Block 142 depicts outputting an error indication. Thereafter, block 144 illustrates stopping the test. Next, block 146 depicts performing a binary search whereafter the process returns. In effect, performing a binary search requires first sampling data into the trace array at a smaller sampling rate, storing "good" signatures from the trace array to the result registers and rerunning the test. These steps are performed multiple times, with the sampling rate binarily decreasing, until the failed signature is detected. In particular, the sampling rate is manually set to achieve a binary decrease between each testing run.

Figure 5:
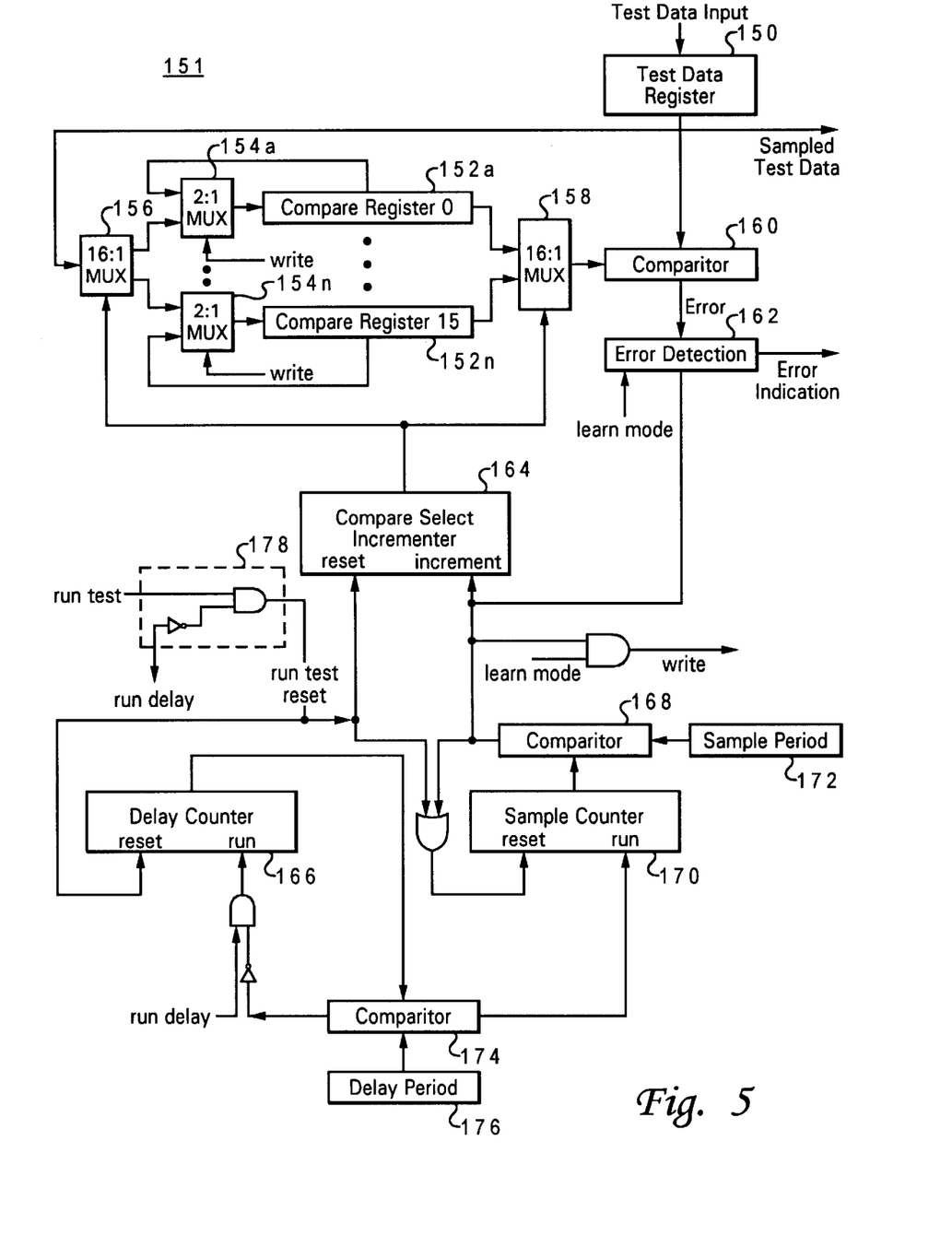
FIG. 5 depicts a detailed block diagram of a result checker which includes a MISR learn mode.

Referring now to FIG. 5, there is depicted a block diagram of a result checker which includes a MISR learn mode. In particular, result checker 151 includes a learn mode during which compare registers 152a–152n may be set to load test data at a particular sample period. In addition, result checker 151 includes a test mode during which data is compare registers 152a–152n is compared with test data from the DUTs for each sample period. By utilizing the learn mode, a binary search may be performed where the alteration of a delay period 176 and sampling period 172 during the search are performed by an automated process, without the need for human intervention as in FIG. 4.

Test data from the DUTs is received at the result checker as test data input and is placed in a test data register 150 each clock cycle. The data in test data register 150 is output as sampled test data to a trace array and is received as input to an input MUX 156 which is a 1-to-N MUX. An output of input MUX 156 is selected by a compare select incrementer 164 which in this example is a 4-bit counter, however in other embodiments may be an alternate size counter. Depending on the selection made in input MUX 156, the test data is passed to one of 2:1 MUXs 154a–154n. Each 2:1 MUX 154a–154n includes two inputs which are selected based on a write signal which is determined as will be further described. When in learn mode, the write signal may be enabled to direct the test data to be stored in one of compare registers 152a–152n. However, when not in learn mode, the write signal is not enabled and the data already in compare registers 152a–152n is regenerated thereto. To control data output from compare registers 152a–152n, an output MUX 158, which is an N-to-1 MUX, allows output of data from a compare register 152a–152n selected by the value of compare select incrementer 164.

The data output from output MUX 158 is compared with the test data by comparitor 160. If the two data entries to comparitor 160 are not equal, a high error signal is provided. Error detection unit 162 detects the error signal from comparitor 160 and determines if an error indication should be provided. The error indication signal is preferably provided to the test engine to stop testing. In particular, if learn mode is off and the sample period is restarted, the error indication is enabled in the case of an error signal output from comparitor 160.

A delay period 176 and sample period 172 determine cycles of time during which data is compared. Delay period 176 and sample period 172 values are automatically configured externally to the circuit before each iteration of the test run. In particular, delay period 176 determines how many cycles to wait before starting periodic test delay sampling. Sample period 172 determines the frequency of data sampling.

A run test signal is provided externally to the result checker. A reset circuit 178 for the run test is depicted. When the run test signal is first provided, the signal is delayed by a clock cycle within reset circuit 178 and output as a run delay signal. In the case of resetting the run test, the run test signal is turned off and then turned on again. The reset circuit will output a run test reset signal when this-occurs which will reset compare select incrementer 164, sample counter 170 and delay counter 166.

Delay counter 166 increments while the run delay signal is on and delay period 176 has not been exceeded. A comparator 174 compares the output of delay counter 166 and delay period 176. When delay counter 166 equals delay period 176, comparitor 174 outputs a high signal which enables sample counter 170 to run.

Sample counter 170 is compared with sample period 172 by comparitor 168. When sample counter 170 equals sample period 172, comparitor 168 outputs a high signal which resets sample counter 170 and increments compare select incrementer 164. In particular, when comparitor 168 outputs a high signal, an indication is provided that a sample period is complete. Further, during learn mode, the high signal from comparitor 168 enables the write signal for writing sampled data to a compare register depending on the current bit count of compare select incrementer 164.

Figure 6:
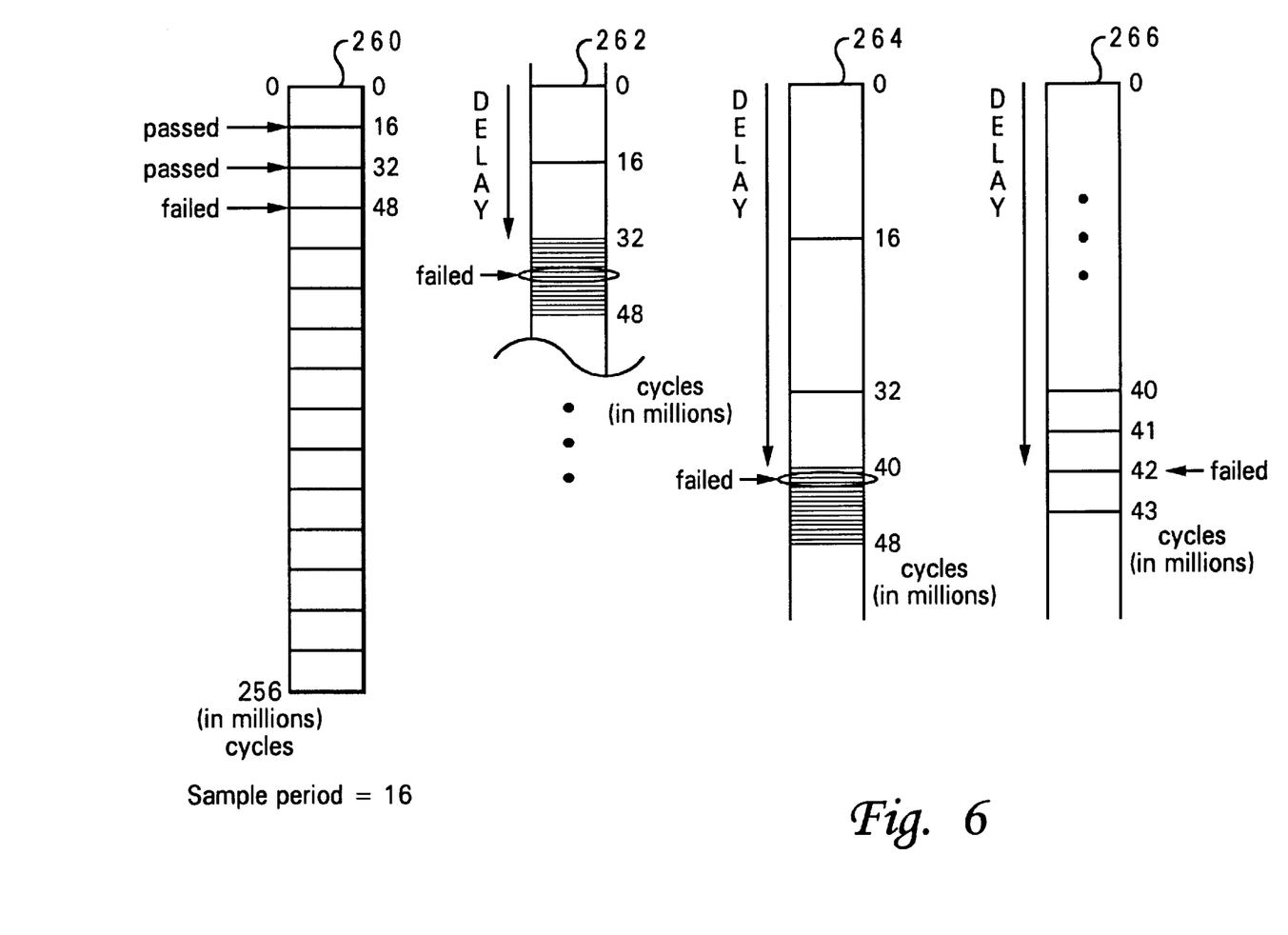
FIG. 6 illustrates a pictorial illustration of a binary search.

With reference now to FIG. 6, there is depicted a pictorial illustration of a binary search. Result checker 151 of FIG. 5 is well suited for quick binary searching to locate a failing signature and cycle. In the present example, sample counter 170 is preferably a 16-bit counter and delay counter 166 is a 20-bit counter. Thereby, delay counter 166 is the size of the sum of the bits of sample counter 170 and compare select incrementer 164 in order to allow a binary search window. For this example, a test run may take 256 million cycles. The signature may be periodically sampled 16 times or every 16 million cycles. The MISR learn mode is then rerun at the same sampling period as depicted at reference numeral 260. In the learn mode run, the first and second sampling periods pass, however an error is detected for the third sampling period. A delay of 32 million cycles is entered to delay counter 166. The MISR learn mode is then rerun in the new window, as illustrated at reference numeral 262, at a different sampling period to record 16 different signatures, one every 1 million cycles, between 32 million cycles and 48 million cycles. The MISR learn mode for performing a binary search is repeatedly rerun without a need for human intervention, as depicted at reference numeral 264 and 266, until the exact cycle of failure is determined. Further, once the failed signature is detected, the sampled test data output to the trace array may be analyzed for the failing signature to detect the patterns of data which led to the failure.

Figure 7A:
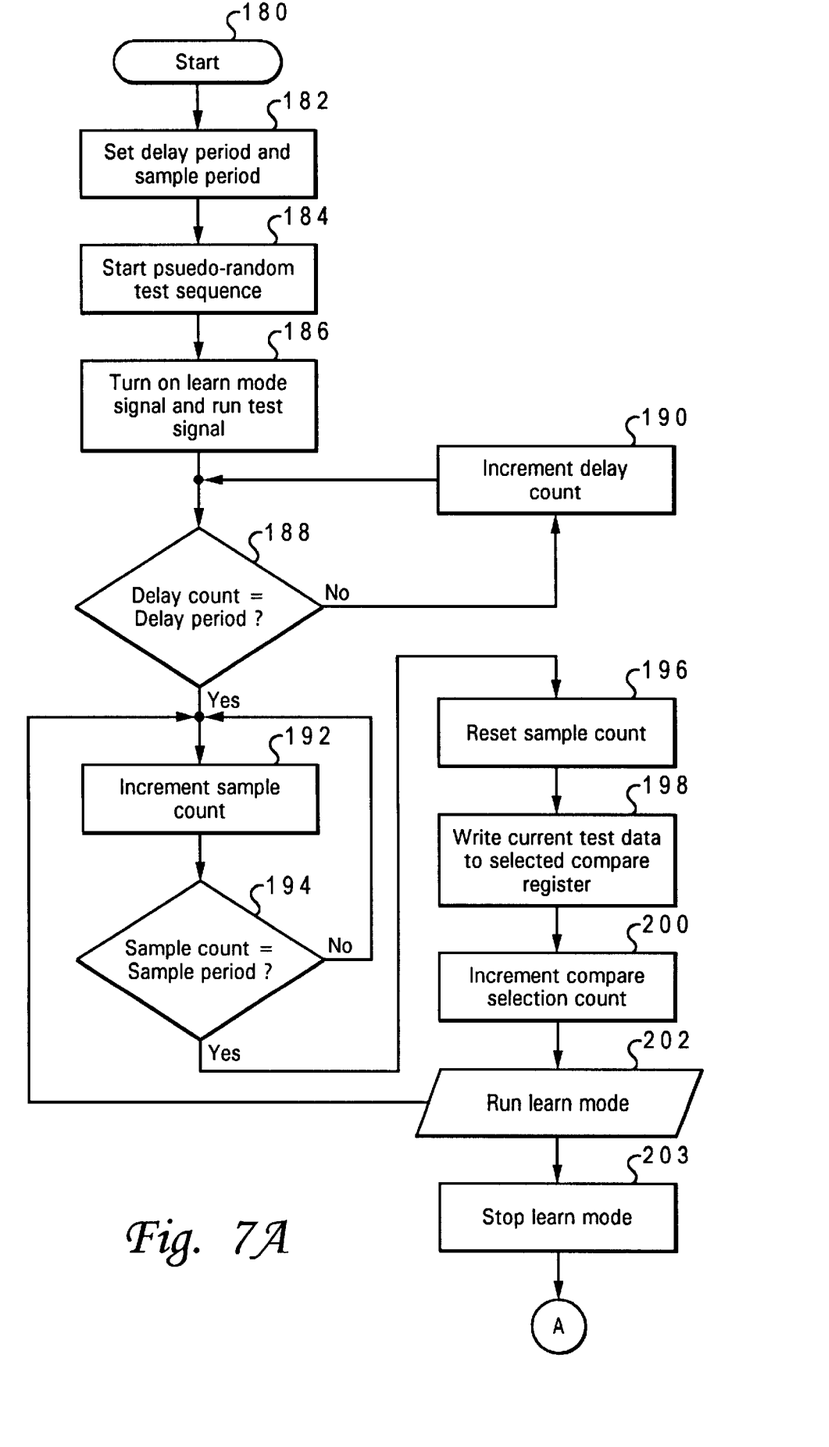
FIG. 7 depicts a high level logic flowchart of a process for pseudo-random data testing by the result checker of FIG. 5.
Figure 7B:
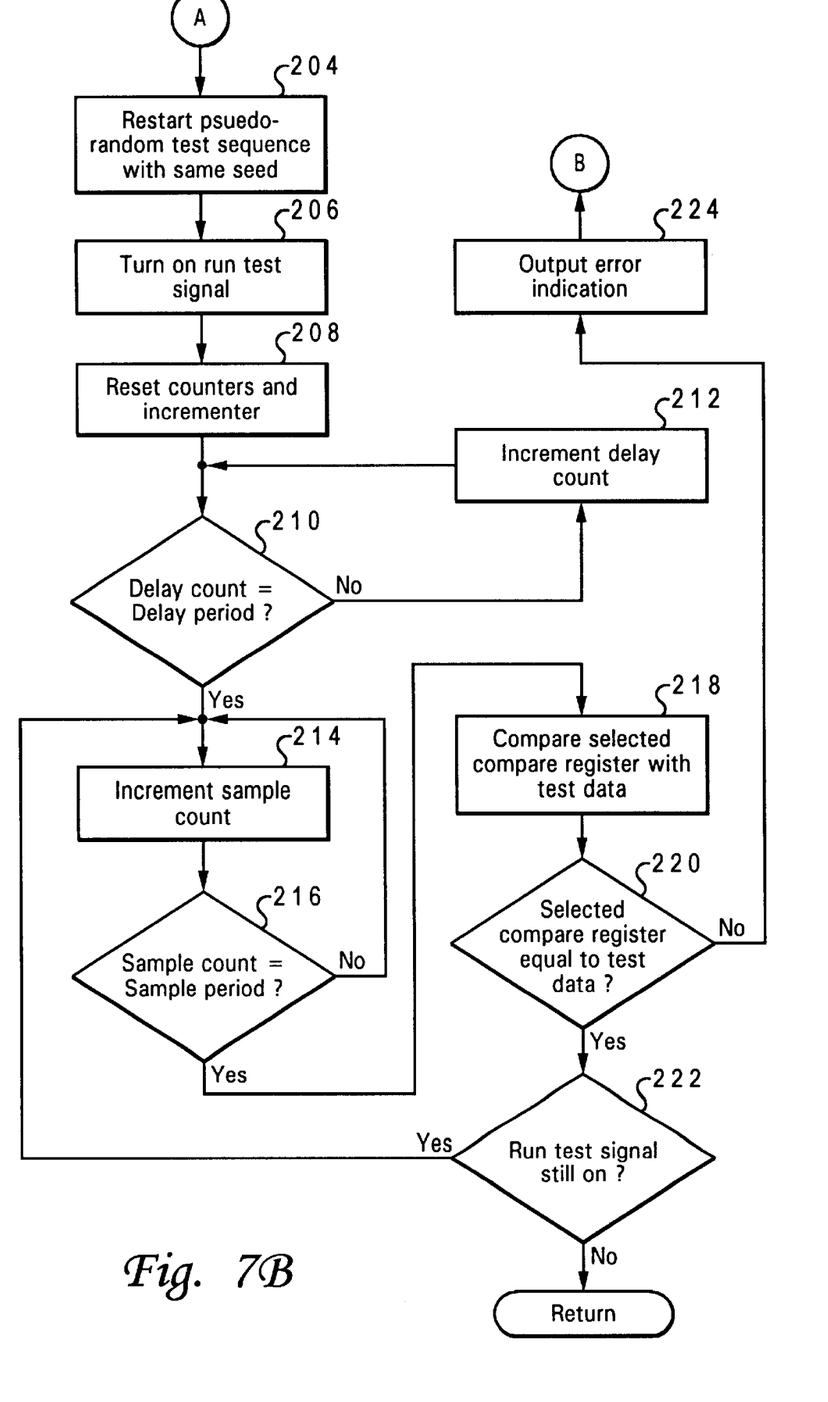

With reference now to FIG. 7, there is illustrated a high level logic flowchart of a process for pseudo-random data testing by the automated result checker of FIG. 5. As depicted, the process starts at block 180 and proceeds to block 182. Block 182 illustrates setting the delay period and sample period values. These values can be calculated and provided from an automated source external to the result checker. Thereafter, block 184 depicts starting a psuedo-random test sequence in a pattern generator where the test sequence data is passed through multiple DUTs and output to the result checker as test data. Next, block 186 illustrates turning on the learn mode signal and run test signal in order to sample data. Thereafter, block 188 depicts a determination of whether the delay count value equals the delay period value. If the values are not equal, the process passes to block 190. Block 190 illustrates incrementing the delay count value whereafter the process passes back to block 188.

At block 188, if the values are equal, the process passes to block 192. Block 192 depicts incrementing the sample count value. Thereafter, block 194 illustrates a determination of whether the sample count value equals the sample period value. If the values are not equal, the process passes to block 192. If the values are equal, the process passes to block 196. Block 196 depicts resetting the sample count value. Thereafter, block 198 illustrates writing the current test data to the selected compare register. Next, block 200 depicts incrementing the compare selection count.

Block 202 depicts running the result checker in learn mode wherein the process passes from block 202 to block 192 while learn mode is still turned on. Block 203 illustrates stopping the learn mode sequence. Thereafter, block 204 depicts restarting the pseudo-random test sequence with the same seed. Next, block 206 illustrates turning on the run test signal. Thereafter, block 208 depicts resetting the counters and incrementers. Next, block 210 illustrates a determination of whether the delay count value equals the delay period value. If the values are not equal, the process passes to block 212. Block 212 depicts incrementing the delay count whereafter the process passes back to block 210. If the values are equal, the process passes to block 214. Block 214 illustrates incrementing the sample count value. Thereafter, block 216 depicts a determination of whether the sample count value equals the sample period. If the values are not equal, the process passes to block 214. If the values are equal, the process passes to block 218.

Block 218 illustrates comparing the selected compare register with the current test data. Thereafter, block 220 depicts a determination of whether the selected compare register equals the present test data. If the data is not equal, the process passes to block 224. Block 224 illustrates outputting an error indication whereafter the process passes at "B" to a process continued in FIG. 8 as will be further described. If the data is equal, the process passes to block 222. Block 222 depicts a determination of whether the run test signal is still on. If the run test signal is still on, the process passes to block 214. If the run test signal is not still on, the process returns.

Figure 8:
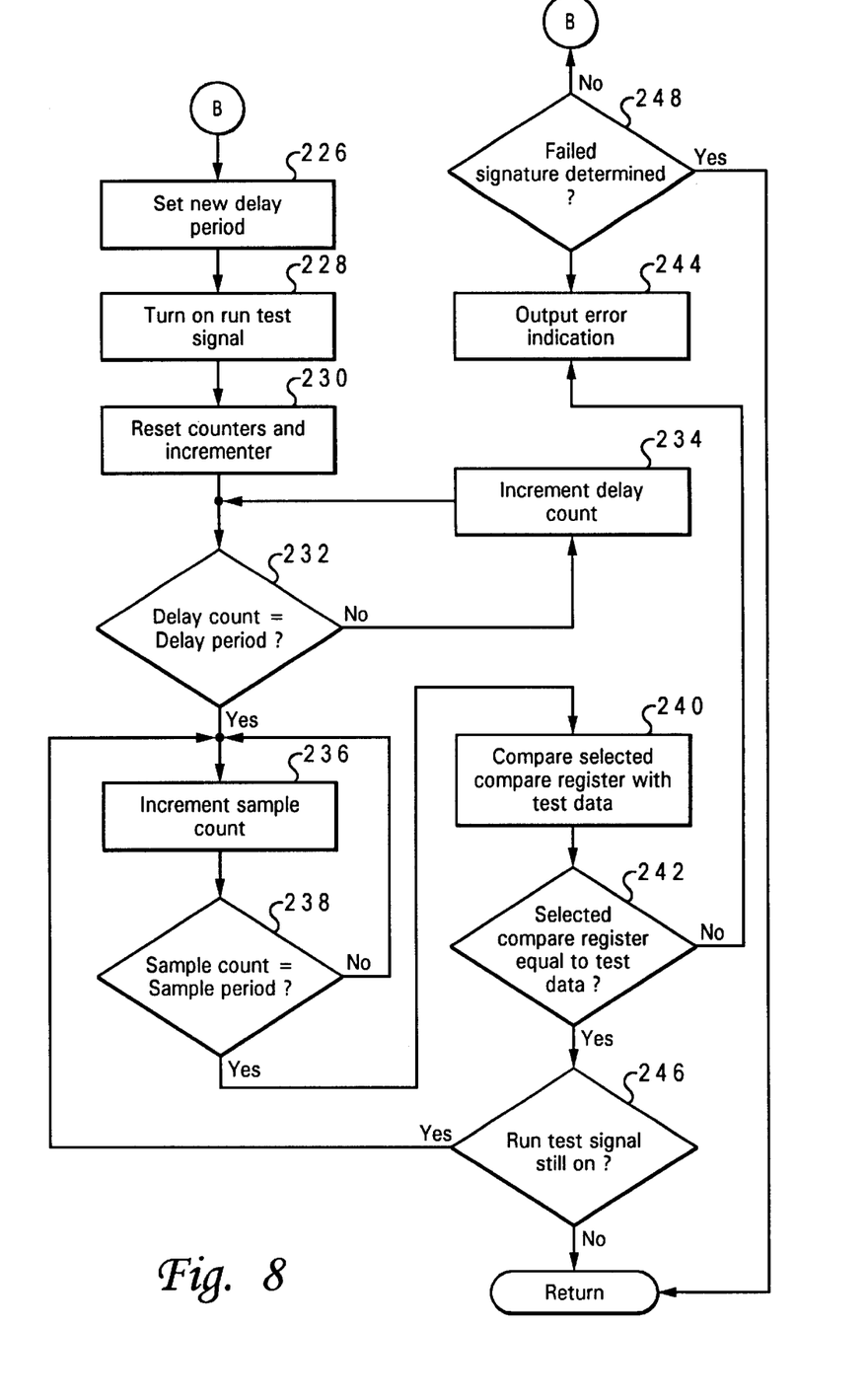
FIG. 8 depicts a high level logic flowchart of a process for performing a binary search within the result checker to locate the exact signature at which an error occurs.

Referring now to FIG. 8, there is depicted a high level logic flowchart of a process for performing a binary search within the result checker to locate the exact signature at which an error occurs. As illustrated, the process starts at "B", continued from FIG. 7, and proceeds to block 226. Block 226 depicts setting a new delay period. The new delay period is determined in order to delay sampling until the sample period in which the error was detected. Thereafter, block 228 illustrates turning on the run test signal. Next, block 230 depicts resetting the counters and incrementer. Thereafter, block 232 illustrates a determination of whether the delay count value is equal to the delay period value. If the values are not equal, the process passes to block 234. Block 234 depicts incrementing the delay count value whereafter the process passes back to block 232. If the values are equal, the process passes to block 236. Block 236 illustrates incrementing the sample count value. Thereafter, block 238 illustrates a determination of whether the sample count value equals the sample period value. If the values are not equal, the process passes back to block 236. If the values are equal, the process passes to block 240.

Block 240 depicts comparing the selected compare register value with the current test data. Thereafter, block 242 illustrates a determination of whether the selected compare register is equal to the current test data. If the selected compare register is not equal to the current test data, the process passes to block 244. Block 244 depicts outputting an error indication whereby the test engine stops running the psuedo-random test sequence. Thereafter, block 248 illustrates a determination of whether the failed signature is determined. If the failed signature is not determined, the process passes back to block 226. If the failed signature is determined, the process returns and the failed signature is obtained from the trace array.

Returning to block 242, if the selected compare register value is not equal to the current test data, the process passes to block 246. Block 246 illustrates a determination of whether the run test signal is still on. If the run test signal is still on, the process passes back to block 236. If the run test signal is not on, the process returns.

While the invention has been particularly shown and described with reference to a preferred embodiment, it will be understood by those skilled in the art that various changes in form and detail may be made therein without departing from the spirit and scope of the invention.

What is claimed is:

1. A method of testing an integrated circuit, said method comprising the steps of:

providing a test substrate which is manufactured by a same particular production technology for which said integrated circuit is designed;

embedding a pattern generator for generating test data and a result checker for comparing output data on said test substrate;

selectively embedding isolated portions of circuitry of said integrated circuit onto said test substrate;

applying test data from said pattern generator to said isolated portions of circuitry under a first operating condition;

selectively recording the data output from said isolated portions of circuitry into said result checker;

subjecting said isolated portions of circuitry to testing by applying test data from said pattern generator to said isolated portions of circuitry under a second operating condition;

detecting errors in said isolated portions of circuitry with said result checker by comparing data output from said isolated portions of circuitry with said selectively recorded data output, such that said integrated circuit is tested by subsets, independently of testing said integrated circuit in its entirety.

2. The method of testing an integrated circuit according to claim 1, said step of selectively recording the data output from said isolated portions of circuitry into said result checker further comprising the steps of:

accumulating an MISR signature for said data output from said isolated portions of circuitry; and recording said MISR signature at a predetermined periodic rate.

3. The method of testing an integrated circuit according to claim 2, said step of recording said MISR signature at said predetermined periodic rate further comprising the steps of:

recording said MISR signature for each cycle of data into a trace array;

copying said MISR signature from said trace array into a register set of said result checker, wherein for each period of said predetermined rate a single MISR signature is copied.

4. The method of testing an integrated circuit according to claim 1, said step of subjecting said isolated portions of circuitry to testing by applying test data from said pattern generator to said isolated portions of circuitry under a second operating condition further comprising the steps of:

accumulating an MISR signature for said data output from said isolated portions of circuitry.

5. The method of testing an integrated circuit according to claim 1, said step of detecting errors in said isolated portions of circuitry with said result checker by comparing data output from said-isolated portions of circuitry with said selectively recorded data output further comprising the steps of:

comparing a recorded MISR signature from said first application of test data with a current MISR signature accumulated in said second application of test data; and indicating an error if said recorded MISR signature is not equal to said current MISR signature.

6. The method of testing an integrated circuit according to claim 1, said method further comprising the step of:

performing a binary search, in response to detecting an error.

7. The method of testing an integrated circuit according to claim 1, said step of detecting errors in said integrated circuit by comparing current data output from said integrated circuit with said selectively recorded data at said predetermined periodic rate in said memory subsystem further comprising the steps of:

comparing a recorded MISR signature from said first application of test data with a current MISR signature accumulated in said second application of test data; and indicating an error if said recorded MISR signature is not equal to said current MISR signature.

8. A test chip for testing an integrated circuit, said test chip comprising:

a test substrate;

means for manufacturing said test substrate by the same production technology by which an integrated circuit is designed to be manufactured;

isolated portions of circuitry of said integrated circuit selectively embedded on said test substrate;

a pattern generator embedded on said test substrate for subjecting said isolated portions of circuitry to testing by the application of test data thereto;

a result checker embedded on said test substrate for detecting errors in said isolated portions of circuitry;

means for applying test data from said pattern generator to said isolated portions of circuitry under a first operating condition;

means for selectively recording the data output from said isolated portions of circuitry into a memory subsystem within said result checker;

means for subjecting said isolated portions of circuitry to testing by applying test data from said pattern generator to said isolated portions of circuitry under a second operating condition;

means for detecting errors in said isolated portions of circuitry with said result checker by comparing data output from said isolated portions of circuitry with said selectivery recorded data output from said memory subsystem of said result checker, such that said integrated circuit is tested by subsets, independently of testing said integrated circuit in its entirety.

9. The system for testing an integrated circuit according to claim 8, said means for selectively recording the data output from said isolated portions of circuitry into said result checker further comprising:

means for accumulating an MISR signature for said data output from said isolated portions of circuitry; and means for recording said MISR signature at said predetermined periodic rate.

10. The system for testing an integrated circuit according to claim 8, said means for recording said MISR signature at said predetermined periodic rate further comprising:

means for recording said MISR signature for each cycle of data into a trace array of said result checker;

means for copying said MISR signature from said trace array into said memory subsystem of said result checker, wherein for each period of said predetermined rate a single MISR signature is copied.

11. The system for testing an integrated circuit according to claim 8, said means for subjecting said isolated portions of circuitry to testing by applying test data from said pattern generator to said isolated portions of circuitry under a second operating condition further comprising:

means for accumulating an MISR signature for said data output from said isolated portions of circuitry.

12. The system for testing an integrated circuit according to claim 8, said means for detecting errors in said isolated portions of circuitry with said result checker by comparing data output from said isolated portions of circuitry with said selectively recorded data output further comprising:

means for comparing a recorded MISR signature from said first application of test data with a current MISR signature accumulated in said second application of test data; and means for indicating an error if said recorded MISR signature is not equal to said current MISR signature.

13. The system for testing an integrated circuit according to claim 8, said system further comprising:

means for performing a binary search, in response to detecting an error.

14. A method of testing an integrated circuit, said method comprising the steps of:

applying test data from said pattern generator to said integrated circuit under a first operating condition;

selectively recording the data output from said integrated circuit into a memory subsystem at a predetermined periodic rate after a predetermined delay;

subjecting said integrated circuit to testing by applying test data from said pattern generator to said integrated circuit under a second operating condition;

detecting errors in said integrated circuit by comparing current data output from said integrated circuit with said selectively recorded data at said predetermined periodic rate in said memory subsystem;

in response to detecting an error, resetting said predetermined periodic rate and said predetermined delay, wherein said integrated circuit is automatically retested where a decreased window of data will be selectively recorded such that through retesting a cycle of failure may be determined.

15. The method of testing an integrated circuit according to claim 14, said step of selectively recording the data output from said integrated circuit into a memory subsystem at a predetermined periodic rate after a predetermined delay further comprising the steps of:

accumulating an MISR signature for said data output from said integrated circuit; and recording said MISR signature into said memory subsystem at said predetermined periodic rate.

16. The method of testing an integrated circuit according to claim 15, said step of recording said MISR signature into said memory subsystem at said predetermined periodic rate further comprising the steps of:

prohibiting the recordation of said MISR signature for a delay period;

starting a sampling period after said delay period has expired;

recording said MISR signature at the conclusion of said delay period;

restarting said sampling period;

incrementing the position in said memory subsystem in which said next MISR signature is stored.

17. The method of testing an integrated circuit according to claim 14, said step of subjecting said integrated circuit to testing by applying test data from said pattern generator to said integrated circuit under a second operating condition further comprising the steps of:

accumulating an MISR signature for said data output from said isolated portions of circuitry.

* * * * *

UNITED STATES PATENT AND TRADEMARK OFFICE
CERTIFICATE OF CORRECTION

PATENT NO.   : 6,393,594 B1
DATED        : May 21, 2002
INVENTOR(S)  : Anderson et al.

It is certified that error appears in the above-identified patent and that said Letters Patent is hereby corrected as shown below:

Column 11,
Line 40, please delete "selectivery" and please add -- selectively --

Signed and Sealed this

Thirty-first Day of December, 2002

JAMES E. ROGAN
*Director of the United States Patent and Trademark Office*